(12) United States Patent
Fujita

(10) Patent No.: US 8,581,414 B2
(45) Date of Patent: Nov. 12, 2013

(54) METHOD OF MANUFACTURING THREE-DIMENSIONAL INTEGRATED CIRCUIT AND THREE-DIMENSIONAL INTEGRATED CIRCUIT APPARATUS

(75) Inventor: Shinobu Fujita, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/421,115

(22) Filed: Mar. 15, 2012

(65) Prior Publication Data

US 2012/0223440 A1  Sep. 6, 2012

Related U.S. Application Data

(63) Continuation of application No. PCT/JP2009/004782, filed on Sep. 21, 2009.

(51) Int. Cl.
*H01L 21/48* (2006.01)
(52) U.S. Cl.
USPC ............... 257/774; 257/777; 257/E23.011; 438/109
(58) Field of Classification Search
USPC ................. 257/774, 777; 438/107, 109, 455
See application file for complete search history.

(56) References Cited

U.S. PATENT DOCUMENTS

| 6,355,501 B1 | 3/2002 | Fung et al. |
| 7,346,069 B2* | 3/2008 | Lee et al. ............... 370/431 |
| 2008/0155820 A1* | 7/2008 | Arai et al. ................. 29/830 |

FOREIGN PATENT DOCUMENTS

| JP | 2001-94039 | 4/2001 |
| JP | 2004-47938 A | 2/2004 |

OTHER PUBLICATIONS

Office Action mailed Sep. 11, 2013 in Japanese Application No. 2011-531672 (w/English translation).

* cited by examiner

*Primary Examiner* — Charles Garber
*Assistant Examiner* — Reema Patel
(74) *Attorney, Agent, or Firm* — Oblon, Spivak, McClelland, Maier & Neustadt, L.L.P.

(57) ABSTRACT

In a three-dimensional integrated circuit apparatus 80 in which a first wafer 101 and a second wafer 102 having respective integrated circuits according to an embodiment are directly bonded, the second wafer 102 is provided with a through hole 10 aligned with a via 5a of the first wafer 101 by use of an alignment marker of the first wafer 101, and connected to the via 5a. The surrounding of the through hole 10 is provided with an insulating film 8.

11 Claims, 19 Drawing Sheets

METHOD OF MANUFACTURING THREE-DIMENSIONAL INTEGRATED CIRCUIT AND THREE-DIMENSIONAL INTEGRATED CIRCUIT APPARATUS

CROSS REFERENCE TO RELATED APPLICATION

This application is a continuation application based upon the International Patent Application No. PCT/JP2009/004782, filed on Sep. 21, 2009, the entire contents of which are incorporated herein by reference.

FIELD

Embodiments described herein relate to a method of manufacturing a three-dimensional integrated circuit and a three-dimensional integrated circuit apparatus.

BACKGROUND

Along with the rapid progress in miniaturization and higher performance of electronic systems, development of three-dimensional semiconductor integrated circuit devices is being accelerated. As a typical approach to a three-dimensional technology, there is a chip stacking technology using through electrodes. In the case where a silicon substrate is used, the through electrodes are also referred to as TSV (through silicon vias). Such a three-dimensional technology is disclosed in Japanese Patent Application Publication No. 2004-47938.

With the three-dimensional technology, substrates are bonded via bumps, and then through electrodes and the bumps are bonded. For this reason, accurate alignment between the substrates in the bonding process cannot be performed, and thus there is a problem in that the through electrodes cannot be formed in high density. In addition, there is a problem in that the parasitic capacitance around the through electrodes is large, and thus wiring delay occurs. In the case where a through electrode is used for a signal line as a transmission line, longer line length and larger parasitic capacitance cause the power consumption of an integrated circuit to increase, and thus makes high-speed transmission difficult.

DETAILED DESCRIPTION

Figure 1:
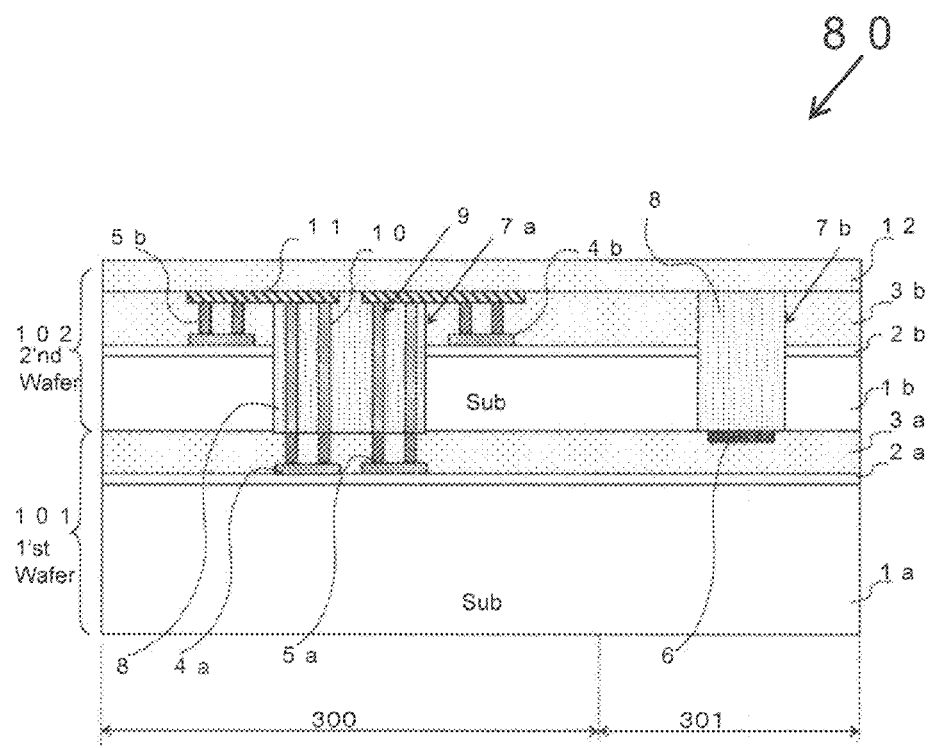
FIG. 1 is a cross-sectional view showing a three-dimensional integrated circuit apparatus according to Embodiment 1.

According to an embodiment, a method of manufacturing a three-dimensional integrated circuit is comprised of the steps of aligning a second wafer provided with a second via with respect to a first wafer provided with an alignment marker, a first via, and a first wiring layer, by use of the alignment marker to stack the second wafer on the first wafer, and bonding a front surface of the first wafer and a back surface of the second wafer, and forming a through electrode in a first region of the second wafer on the first via or the first wiring layer after the bonding of the first and second wafers, the through electrode being aligned with the first via or the first wiring layer by use of the alignment marker and connected to the first via or the first wiring layer.

According to another embodiment, a three-dimensional integrated circuit apparatus is comprised of a first chip provided with a first via and a first wiring layer, n pieces of chips (n is an integer equal to or greater than 1) stacked and bonded on a front surface side of the first chip, a first insulating film buried in a first through hole provided in a first region of the n pieces of chips located on the first via or the first wiring layer; and a through electrode provided in the first insulating film, and buried in a second through hole being narrower than the first through hole in width in such a manner as to be in contact with the first via or the first wiring layer, a top of the through electrode being connected to a wiring layer of a chip in an uppermost layer among the n pieces of chips.

Hereinafter, several embodiments will be described with reference to the drawings. In the drawings, the same reference numeral indicates the same or similar portion.

Embodiment 1

Figure 2:
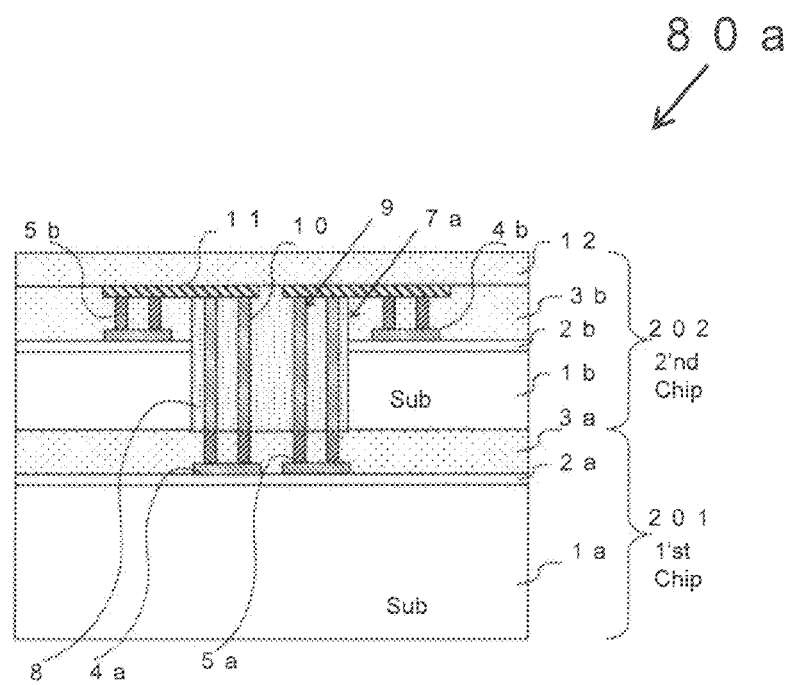
FIG. 2 is a cross-sectional view showing the three-dimensional integrated circuit apparatus according to Embodiment 1.

First, a method of manufacturing a three-dimensional integrated circuit and a three-dimensional integrated circuit apparatus according to Embodiment 1 are described with reference to the drawings. FIG. 1 is a cross-sectional view showing the three-dimensional integrated circuit apparatus, and FIG. 2 is a cross-sectional view showing a separated individual piece of the three-dimensional integrated circuit apparatus. In the embodiment, an insulating film is buried in a second wafer, and a plurality of microscopic through electrodes is provided in a region where the insulating film is formed, the through electrodes being aligned with alignment markers in a first wafer with high accuracy.

As shown in FIG. 1, a three-dimensional integrated circuit apparatus 80 has a configuration in which a first wafer (1'st Wafer) 101 where an integrated circuit is formed, and a second wafer (2'nd Wafer) 102 where an integrated circuit is formed are directly bonded to each other (Front to Back).

An integrated circuit formation region 300 of the first wafer 101 is provided with a wiring layer 4a on a semiconductor substrate 1a and an insulating film 2a (the wiring layer 4a is provided in the horizontal direction in FIG. 1). The wiring layer 4a is electrically connected to an integrated circuit (not shown) in the first wafer 101. A via 5a is an electrode that is buried in an opening which is provided in an insulating film 3a on the wiring layer 4a so that the via 5a is in contact with the wiring layer 4a (the via 5a is provided in the vertical direction in FIG. 1). In an alignment region 301 of the first wafer 101, an alignment marker 6 is provided on the insulating film 3a.

A plurality of alignment markers 6 is placed in a wafer region which is separated from the chip, for example, in which an integrated circuit is provided, and the alignment markers 6 are used as a reference alignment mark in the process of bonding the first wafer 101 and the second wafer 102, or as a reference alignment mark in the process of forming a microscopic through electrode 10 to be provided in the second wafer 102. The details are described later.

In the integrated circuit formation region 300 (the first region) of the second wafer 102, a wiring layer 4b is provided on a semiconductor substrate 1b and an insulating film 2b. The wiring layer 4b is electrically connected to an integrated circuit (not shown) of the second wafer 102. A via 5b is buried in an opening which is provided in an insulating film 3b on the wiring layer 4b so that the via 5b is in contact with the wiring layer 4b.

The semiconductor substrate 1b, the insulating film 2b, and the insulating film 3b that are over the vias 5a of the first wafer 101 are etched to form a through hole 7a to expose the surface of vias 5a, in the integrated circuit formation region 300. The semiconductor substrate 1b, the insulating film 2b, and the insulating film 3b that are over the alignment marker 6 of the first wafer 101 are etched to form a through hole 7b to expose the surface of the alignment marker 6, in the alignment region 301 (the second region). An insulating film 8 is buried in the through holes 7a and 7b.

In the region of the insulating film 8 that is buried in the through hole 7a, a plurality of microscopic through holes 9 being narrower than the through hole 7a in width are provided to expose the surfaces of the vias 5a. The through holes 9 are aligned with the respective vias 5a with high accuracy by use of the alignment markers 6 as a reference mark. A through electrode 10 is buried in each of the through holes 9. The through electrode 10 is used for a signal line as a transmission line, a source voltage supply line, a ground wire, or a clock signal line. The through electrode 10 is also referred to as TSV (through silicon vias) when a silicon substrate is used. A wiring layer 11 is provided on the via 5b and the through electrode 10, and interconnects the via 5b and the through electrode 10. The insulating film 12 is provided over the insulating film 3b, the insulating film 8, and the wiring layer 11, and serves as a surface protection film for the three-dimensional integrated circuit apparatus 80.

In the three-dimensional integrated circuit apparatus 80, alignment between a via 5a and the corresponding through electrode 10 is achieved with high accuracy, and thus a plurality of through electrodes 10 can be provided in the insulating film 8. Consequently, the diameter of the through electrodes 10 can be on the order of submicron, and thus the through electrodes 10 may be formed in high density. In addition, the distance between adjacent through electrodes 10 can be larger than the diameter of the through electrodes 10, and the insulating film 8 is provided between adjacent through electrodes 10, and thus the parasitic capacitance around each of the through electrodes 10 may be significantly reduced. Therefore, CR delay caused by the through electrodes 10 may be significantly reduced. Furthermore, the distance between adjacent through electrodes can be relatively large, and thus the electrostatic discharge (ESD) of the three-dimensional integrated circuit apparatus 80 may be improved.

Here, the via 5a is directly connected to the through electrode 10, however, the invention is not limited to this configuration. The via 5a and the through electrode 10, for example, may be connected to each other via a wiring layer on the via 5a. Although two through electrodes 10 are connected to the wiring layer 11, the invention is not limited to this configuration. Three or more through electrodes 10 may be connected to the wiring layer 11, or one through electrode 10 may be connected to the single wiring layer.

As shown in FIG. 2, a three-dimensional integrated circuit apparatus 80a is a separated individual piece of the three-dimensional integrated circuit apparatus 80, where a first chip 201 and a second chip 202 are stacked together. Due to the individual separation, the alignment region 301 is not included in the separated individual chips. The three-dimensional integrated circuit apparatus 80a is electrically connected to a substrate by a bump, a bonding wire, or the like, for example, and is used as a three-dimensional integrated circuit which is sealed and highly integrated.

Next, a method of manufacturing the three-dimensional integrated circuit apparatus will be described with reference to the drawings. FIGS. 3 to 8 and 10 are cross-sectional views each showing a manufacturing process of the three-dimensional integrated circuit apparatus, and FIG. 9 is a plan view showing microscopic through holes.

Figure 3A:
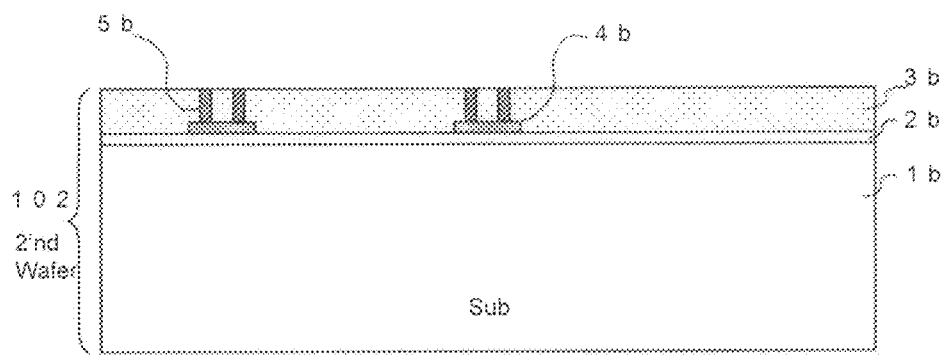
FIG. 3 is a cross-sectional view showing a manufacturing process of the three-dimensional integrated circuit apparatus according to Embodiment 1.
Figure 3B:
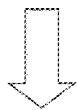
Figure 3B:
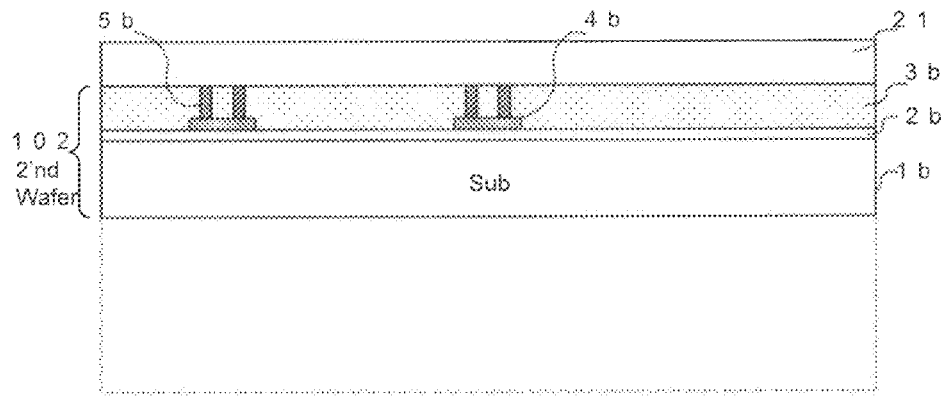

As shown in FIG. 3, the back surface of the second wafer 102, which is a silicon wafer and in which an integrated circuit is formed, is polished and undergoes mirror-finishing processing so that the second wafer 102 is made thinner. At this stage, the back surface polishing and the mirror-finishing processing are performed with a holding member 21 being secured to the surface of the second wafer 102 so that no fracture or scratch of the wafer occurs. The second wafer 102 is made to a thickness in a range of 30 to 50 μm. Here, the second wafer 102 is made to a thickness of 50 μm. Silica glass, for example, is preferably used for the holding member 21, the silica glass being less deformed by heat and light transmissive so that alignment can be performed when the wafers are bonded. A transparent adhesive sheet to bond the silica glass and the second wafer 102 is preferably used.

After the second wafer 102 is made thinner, the back surface of the second wafer 102 is roughened by plasma treatment, for example. This back surface roughening treatment is performed for the purpose of increasing the bonding strength between the first wafer 101 and the second wafer 102.

Figure 4:
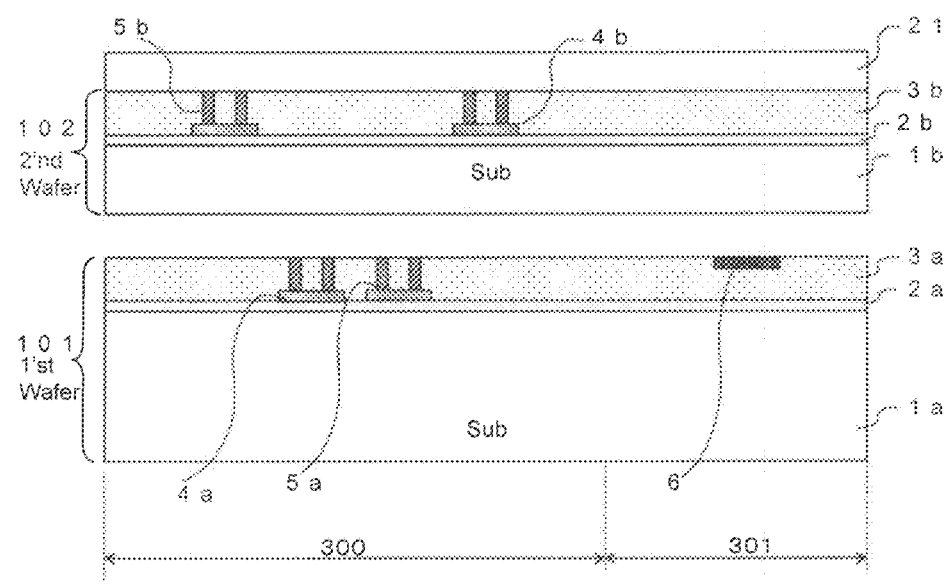
FIG. 4 is a cross-sectional view showing the manufacturing process of the three-dimensional integrated circuit apparatus according to Embodiment 1.

Next, as shown in FIG. 4, the thinned second wafer 102 is placed on the surface of the first wafer 101 which is a silicon wafer and in which an integrated circuit is formed so that the back surface of the second wafer 102 faces (Front to Back) the surface of the first wafer 101. The first wafer 101 and the second wafer 102 are aligned with each other by use of the alignment marker 6 of the first wafer 101 as a reference mark.

Figure 5:
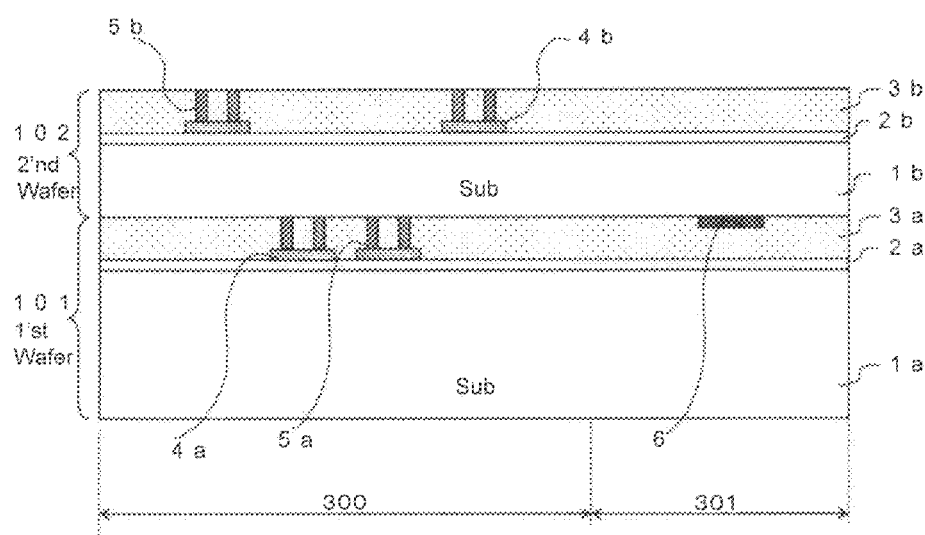
FIG. 5 is a cross-sectional view showing the manufacturing process of the three-dimensional integrated circuit apparatus according to Embodiment 1.

Subsequently, as shown in FIG. 5, the first wafer 101 and the second wafer 102 are bonded together by thermocompression bonding after the alignment. The thermocompression bonding is performed at a low heating temperature on the order of e.g., 200° C. so that the wiring and the elements of the integrated circuit do not deteriorate.

In the embodiment, the alignment and the wafer bonding are performed by using a conventional wafer bonder. With a conventional wafer bonder, alignment is performed by using infrared light which has a relatively long wavelength and transmits through the semiconductor substrate 1b which is a silicon substrate. Therefore, the accuracy of the alignment is on the order of 1 μm, for example, and thus it is difficult to perform the alignment with high accuracy.

Figure 6:
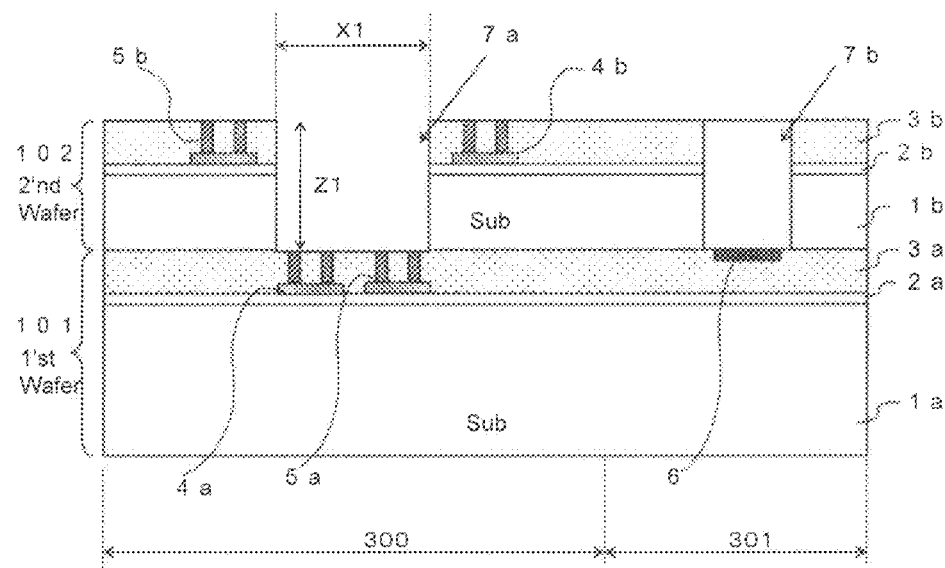
FIG. 6 is a cross-sectional view showing the manufacturing process of the three-dimensional integrated circuit apparatus according to Embodiment 1.

Then, as shown in FIG. 6, after the holding member 21 is removed, a region of the second wafer 102 on the vias 5a of the integrated circuit formation region 300 of the first wafer 101 is etched, the region having a dimension X1 in the X direction and a dimension Z1 in the depth (50 μm), and thus a large through hole 7a is formed to expose the vias 5a. In addition, the second wafer 102 portion on the alignment marker 6 in the alignment region 301 of the first wafer 101 is etched so that a relatively large-volume through hole 7b is formed to expose the alignment marker 6.

In the embodiment, the through holes 7a and 7b are formed in the same process, however, may be formed in separate processes as needed. Alternatively, the wafer bonding may be performed by using an adhesive instead of by thermocompression bonding. The through holes 7a and 7b are formed by using the well-known lithography method and RIE (Reactive Ion Etching) method. In RIE method, ICP (Inductively Coupled Plasma) system, for example, is used.

Figure 7:
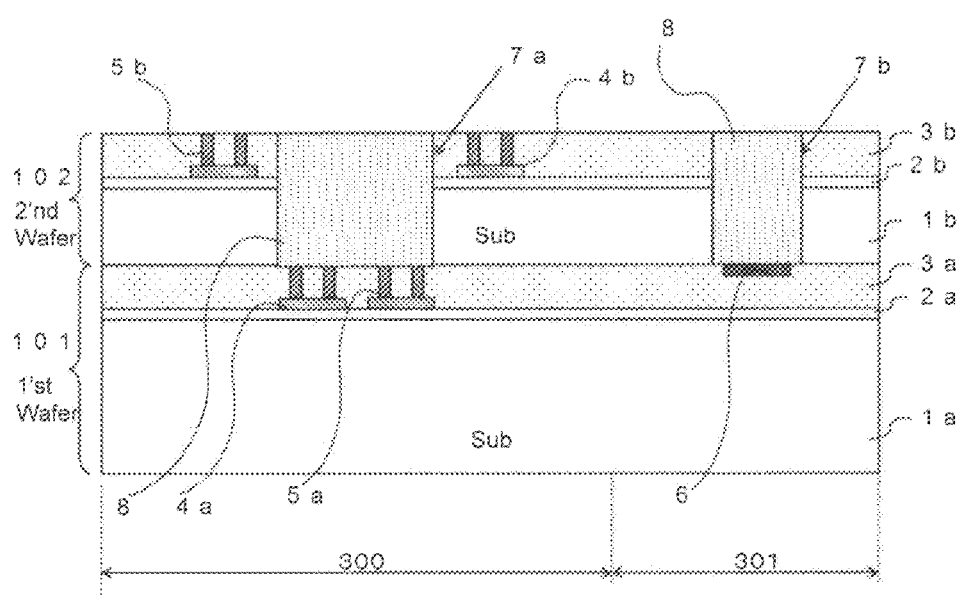
FIG. 7 is a cross-sectional view showing the manufacturing process of the three-dimensional integrated circuit apparatus according to Embodiment 1.

Next, as shown in FIG. 7, after RIE post-processing, the insulating film 8 is buried in the through holes 7a and 7b by using CVD (Chemical Vapor Deposition) method. Specifically, the insulating film 8, after being deposited by CVD method, is polished and flattened by using CMP (Chemical Mechanical Polishing) method.

In the embodiment, silicon dioxide ($SiO_2$) film having a relative permittivity of 4 is used for the insulating film 8, however, instead of the silicon dioxide film, a Low-k insulating film such as a TEOS film (tetraethylorthosilicate film, a relative permittivity on the order of 3), or a SiOC film (SiO film with carbon content, a relative permittivity in a range of 2.6 to 2.9) which has a relative permittivity lower than that of silicon dioxide ($SiO_2$) may be used.

Alternatively, an insulating film may be formed by coating with phosphorus glass material and applying low-temperature heat.

The reason why the insulating film 8 is provided on the alignment marker 6 is that the insulating film 8 has a light transmittance higher than that of the semiconductor substrate 1b which is a silicon substrate, and thus allowing highly accurate alignment and formation of microscopic dimensions to be achieved by using light having a relatively short wavelength (short-wavelength light used in lithography process for a microscopic LSI). That is to say, the alignment marker 6 can be easily detected when a microscopic through hole 9 is formed on a via 5a, the through hole 9 being aligned with the via 5a with high accuracy. If the silicon semiconductor substrate 1b is not removed, highly accurate alignment and formation of microscopic through holes by use of the alignment markers 6 would be difficult.

Figure 8:
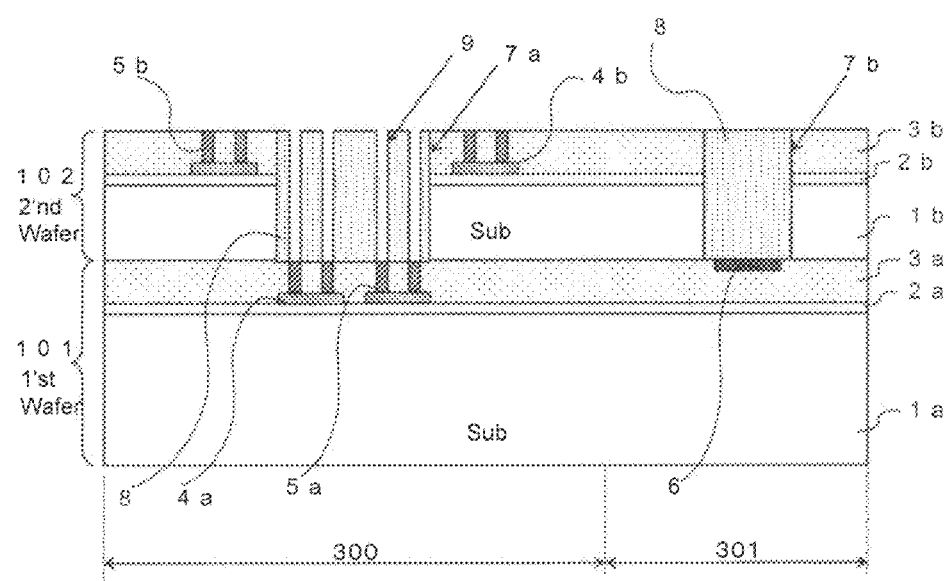
FIG. 8 is a cross-sectional view showing the manufacturing process of the three-dimensional integrated circuit apparatus according to Embodiment 1.
Figure 9:
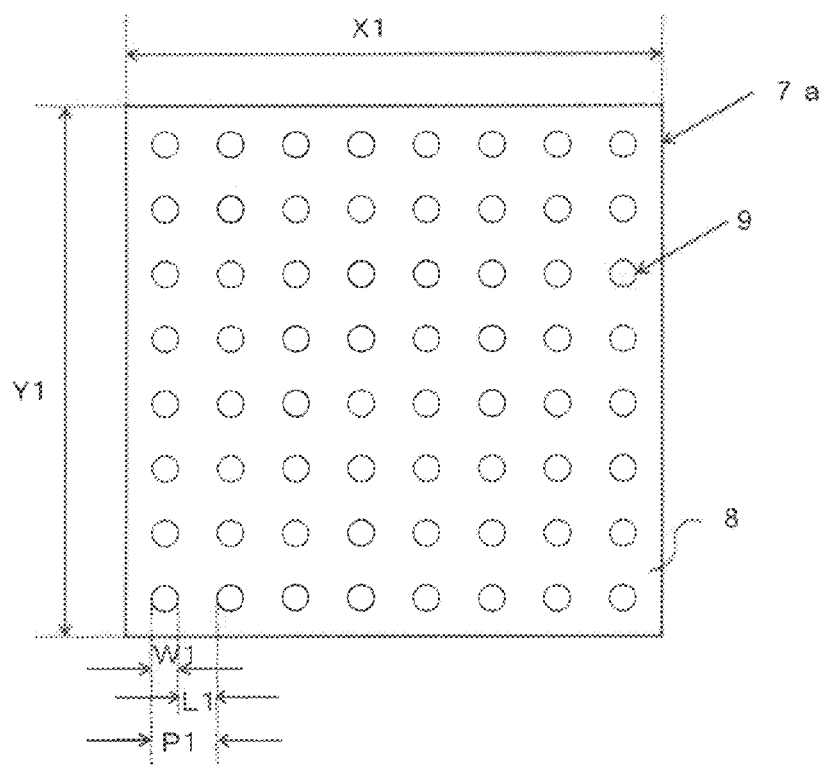
FIG. 9 is a plan view showing microscopic through holes according to Embodiment 1.

Subsequently, as shown in FIG. 8, in a region of the insulating film 8 that is buried in the through hole 7a, the microscopic through hole 9 is formed to expose the via 5a, the through hole 9 being aligned with the via 5a with high accuracy.

The through hole 9 is formed by using the well-known lithography method and RIE method. In the lithography method, the positions of the via 5a and the through hole 9 are aligned with each other with high accuracy in accordance with the alignment marker 6 of the first wafer 101 as a reference mark. By use of the alignment marker 6, accuracy of alignment between the via 5a and the through hole 9 can be on the order of several nm or less. Because the heights of the via 5a and the through hole 9 are different, height correction is preferably made in advance when an optical alignment is performed.

As shown in FIG. 9, 64 pieces of through holes 9 are provided in a region (a dimension X1 in the X direction and a dimension Y1 in the Y direction) of the insulating film 8 which is buried in the through hole 7a. The through holes 9 have a circular cross-section with a width W1. Here, the through holes 9 have a circular cross-section, but may have a rectangular cross-section instead. The through holes 9 are arranged at equal intervals with a pitch P1. The through holes 9 are arranged at a through-hole interval of L1.

The following relationship is set between the width W1 and the through-hole interval L1.

$$W1 \ll L1 \qquad \text{Expression (1)}$$

This setting is for reducing the parasitic capacitance between adjacent through electrodes 10. Specifically, dimensions are set as follows. The dimension X1 in the X direction is 20 μm, the dimension Y1 in the Y direction is 20 μm, the width W1 is 0.5 μm, the pitch P1 is 2.5 μm, and the through-hole interval L1 is 2 μm, for example.

Figure 10:
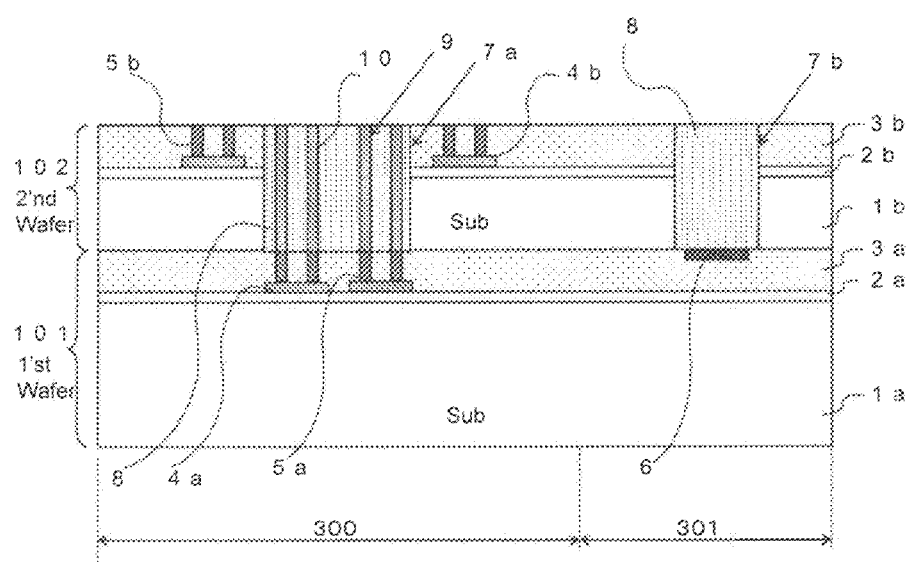
FIG. 10 is a cross-sectional view showing the manufacturing process of the three-dimensional integrated circuit apparatus according to Embodiment 1.

Then as shown in FIG. 10, the through electrodes 10 are buried in the respective through holes 9. Specifically, a barrier metal is deposited on the through holes 9, then tungsten (W) is deposited on the through holes 9 by CVD method. After tungsten (W) is deposited, the barrier metal and tungsten (W) are polished and flattened by using CMP method to form the through electrodes 10. Consequently, 64 pieces of through electrodes with a diameter of 0.5 μM and a length of 50 μm are formed at equal intervals, in a region having dimensions of 20 μm in the X direction, 20 μm in the Y direction, and 50 μm in the Z direction. This configuration is equivalent to what is achieved by high-density multilayer interconnection technology which employs 8 layers of wiring, each layer having 8 signal lines disposed in parallel.

In the embodiment, TiN is used for the barrier metal, however, WN, Ti, or the like may be used instead. Alternatively, copper (Cu) or a carbon nanotube having metallic properties may be used instead of tungsten (W). In the case of copper (Cu), a plating method is used.

The through electrodes 10 may be composed of copper, a carbon nanotube, or highly doped polysilicon.

After the through electrodes 10 are formed, a wiring layer 11 which interconnects the vias 5b and the through electrodes 10 is formed. The wiring layer 11 is formed by a copper plating method using a damascene process, for example. After the wiring layer is formed, an insulating film 12 is formed as a surface protection film on the insulating film 3b, the insulating film 8, and the wiring layer 11.

As described above, in the method of manufacturing a three-dimensional integrated circuit and the three-dimensional integrated circuit apparatus in the embodiment, the first wafer 101 and the second wafer 102 where respective integrated circuits are formed are directly bonded together. The second wafer 102 on the vias 5a of the first wafer 101 is etched to form the through hole 7a to expose the surfaces of the vias 5a. The second wafer 102 portion on the alignment marker 6 of the first wafer 101 is etched to form the through hole 7b to expose the surface of the alignment marker 6. The insulating film 8 is buried in the through holes 7a and 7b. In the region of the insulating film 8 that is buried in the through hole 7a, the through holes 9 are provided to expose the surfaces of the vias 5a, the through holes 9 being narrower than the through hole 7a in width, and being aligned with the respective vias 5a with high accuracy by use of the alignment markers 6. The through electrodes 10 to be connected to the respective vias 5a are buried in the respective through holes 9. The through electrodes 10 are electrically connected to the respective vias 5b of the second wafer 102 via the wiring layer 11. A plurality of through electrodes 10 is provided in the region of the insulating film 8 that is buried in the through hole 7a, and are insulated from each other by the insulating film 8.

Therefore, microscopic through electrodes 10 may be formed in high density. In addition, the parasitic capacitance around each through electrode 10 may be greatly reduced, and required wiring may be shortened, and thus wiring delay may be significantly reduced. Additionally, ESD may be improved. Therefore, it is possible to achieve low power consumption of the three-dimensional integrated circuit apparatus 80 due to shortening of the wiring length and reduction in the parasitic capacitance, miniaturization of the three-dimensional integrated circuit apparatus 80 due to reduction in volume, and improvement in the speed of the three-dimensional integrated circuit.

In the embodiment, the insulating film 8 is buried the second wafer 102 after the bonding of the wafers, however, the insulating film may be buried in the second wafer 102 before the bonding of the wafers. The through electrodes 10 and the wiring layers of the first and second wafers are interconnected by the vias, however, the through electrodes 10 may be directly connected to the wiring layers of the first and second wafers. For example, a plurality of through electrodes to be connected to respective plural wiring layers may be provided in a radial central portion of a wiring layer pattern in which the plural wiring layers extending radially are provided.

Embodiment 2

Figure 11:
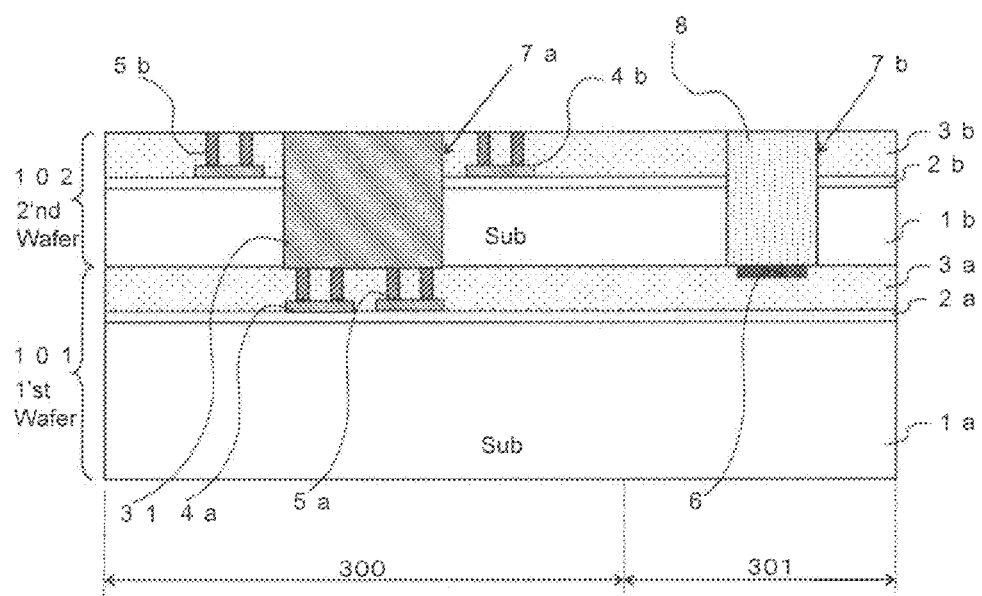
FIG. 11 is a cross-sectional view showing a manufacturing process of a three-dimensional integrated circuit apparatus according to Embodiment 2.
Figure 12:
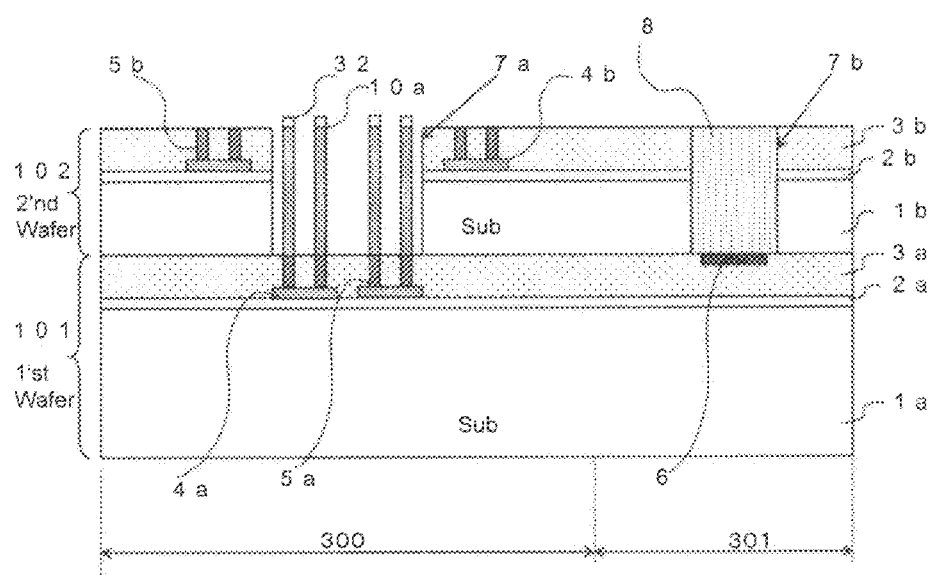
FIG. 12 is a cross-sectional view showing the manufacturing process of the three-dimensional integrated circuit apparatus according to Embodiment 2.
Figure 13:
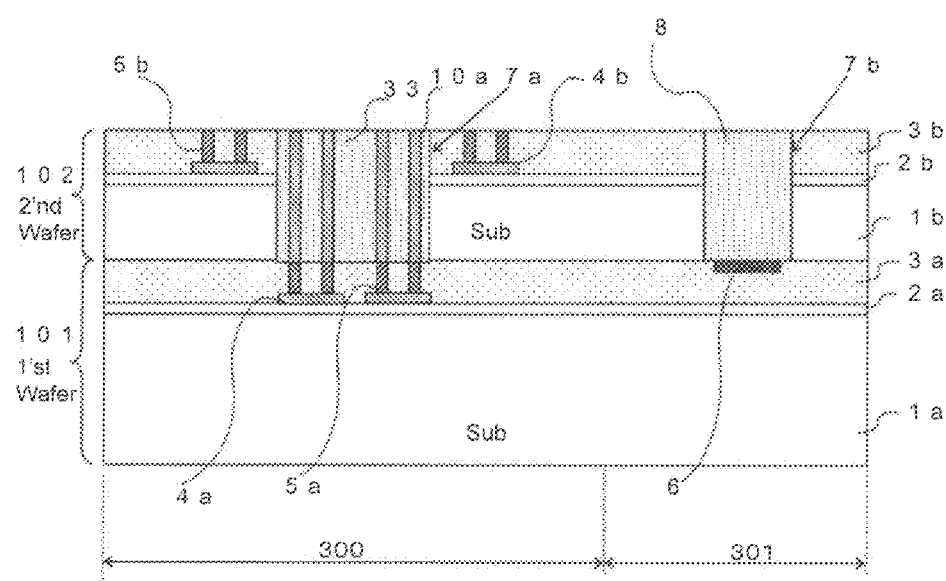
FIG. 13 is a cross-sectional view showing the manufacturing process of the three-dimensional integrated circuit apparatus according to Embodiment 2.

Next, a method of manufacturing a three-dimensional integrated circuit according to Embodiment 2 will be described with reference to the drawings. FIGS. 11 to 13 are circuit diagrams showing the method of manufacturing a three-dimensional integrated circuit. In the embodiment, a modified method of forming microscopic through electrodes is used.

Hereinafter, the same components as those in Embodiment 1 are labeled with the same symbols and description of these components is omitted, and only different components are described.

As shown in FIG. 11, after the through holes 7a and 7b are formed, the insulating film 8 is buried in the through hole 7b. A metal layer 31 is buried in the through hole 7a.

Specifically, after a barrier metal is formed in the through hole 7a, tungsten (W) is buried in the through hole 7a by using CVD. After tungsten (W) is buried, the barrier metal and tungsten (W) are polished and flattened by using CMP method to form the metal film 31. Here, tungsten (W) is buried, however, copper (Cu) may be buried instead. The formation order of the insulating film 8 and the metal layer 31 is not particularly limited to the order stated above.

Next, as shown in FIG. 12, after the polishing and flattening, a mask member 32 is formed on the insulating film 3b, the vias 5b, the insulating film 8, and the metal layer 31. A resist film (not shown) is formed by using the well-known lithography method. In the lithography method, the resist film and the vias 5a are aligned with each other with high precision by use of the alignment markers 6.

The mask member 32 is etched using the resist film as a mask, and the metal layer 31 is etched with RIE method using the mask member 32 as a mask to form the through electrodes 10a. In RIE method, ICP system, for example, is employed, and $SF_6$ is used as an etching gas.

Subsequently, as shown in FIG. 13, after the through-electrodes 10a are formed, the insulating film 33 is buried in the surroundings of the through electrodes 10a. Specifically, the insulating film is deposited on the through hole 7a, and the insulating film and the mask member 32 are polished and flattened by using CMP method to form the insulating film 33. In the embodiment, silicon dioxide ($SiO_2$) film having a relative permittivity of 4 is used for insulating film 33, however, instead of the silicon dioxide film, a Low-k insulating film such as a TEOS film (a relative permittivity on the order of 3), or a SiOC film (a relative permittivity in a range of 2.6 to 2.9) which has a relative permittivity lower than that of silicon dioxide ($SiO_2$) may be used. The subsequent process is the same as that of Embodiment 1, and thus illustration and description are omitted.

As described above, in the method of manufacturing a three-dimensional integrated circuit in the embodiment, the first wafer 101 and the second wafer 102 where respective integrated circuits are formed are directly bonded together. The second wafer 102 portion on the vias 5a of the first wafer 101 is etched to form the through hole 7a to expose the surfaces of the vias 5a. The second wafer 102 portion on the alignment marker 6 of the first wafer 101 is etched to form the through hole 7b to expose the surface of the alignment marker 6. The metal layer 31 is buried in the through hole 7a. The insulating film 8 is buried in the through hole 7b. The mask member 32 is formed on the metal layer 31, the mask member 32 being aligned with the via 5a with high accuracy by use of the alignment marker 6. The metal layer 31 is etched using the mask member 32 as a mask, and the through electrodes 10a to be connected to the respective vias 5a are formed directly under the mask member 32. The insulating film 33 is buried in the surroundings of the through electrodes 10a.

Therefore, Embodiment 2 has similar effects to those of Embodiment 1, and thus it is possible to achieve low power consumption of the three-dimensional integrated circuit apparatus due to shortening of the wiring length and reduction in the parasitic capacitance, miniaturization of the three-dimensional integrated circuit apparatus due to reduction in volume, and improvement in the speed of the three-dimensional integrated circuit.

In the embodiment, the insulating film 8 and the metal layer 31 are buried in the second wafer 102 after the wafers are bonded together, however, the insulating film 8 and the metal layer 31 may be buried in the second wafer 102 before the wafers are bonded together.

Embodiment 3

Figure 14:
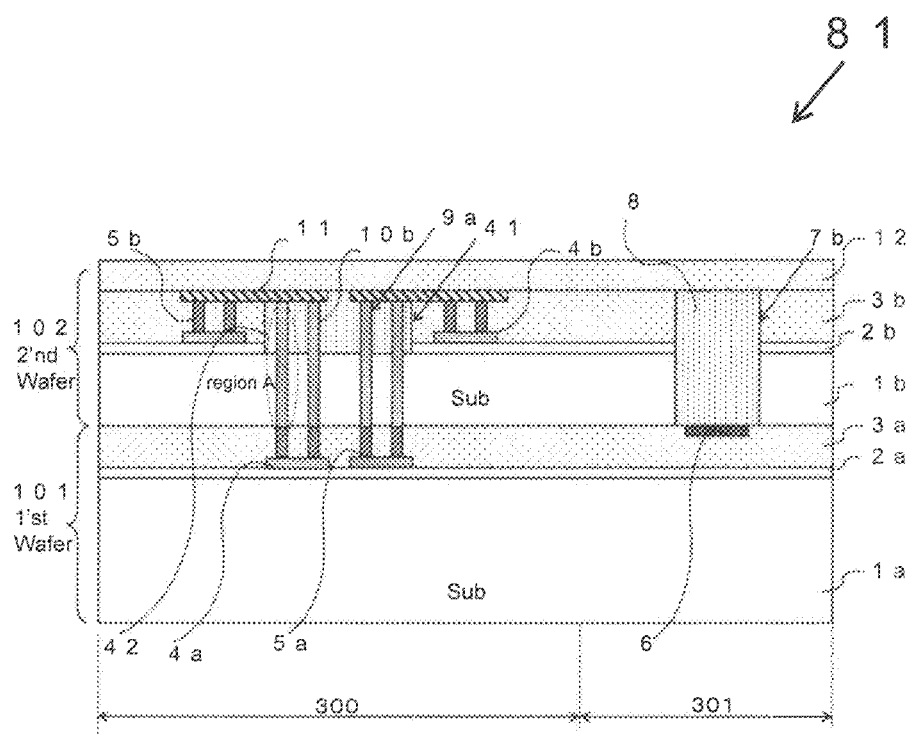
FIG. 14 is a cross-sectional view showing a three-dimensional integrated circuit apparatus according to Embodiment 3.
Figure 15:
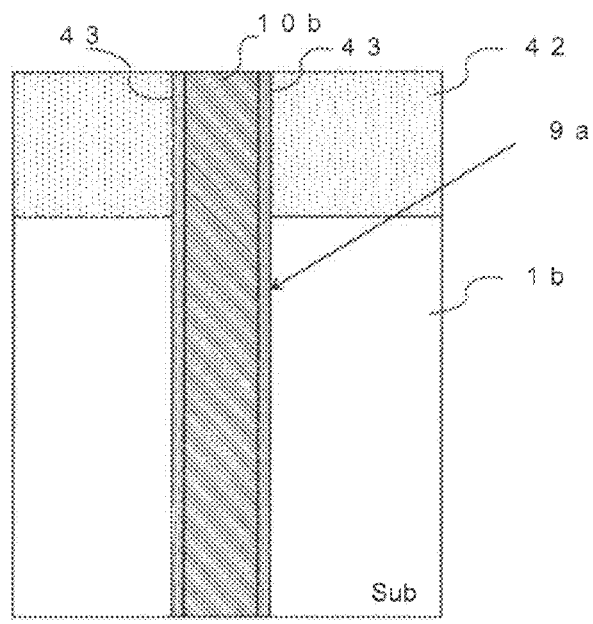
FIG. 15 is an enlarged cross-sectional view of a region A in FIG. 14.

Next, a three-dimensional integrated circuit apparatus according to Embodiment 3 will be described with reference to the drawings. FIG. 14 is a cross-sectional view showing the three-dimensional integrated circuit apparatus, and FIG. 15 is an enlarged cross-sectional view of a region in FIG. 14. In the embodiment, the structure of the through holes is modified.

Hereinafter, the same components as those in Embodiment 1 are labeled with the same symbols and description of these components is omitted, and only different components are described.

As shown in FIG. 14, a three-dimensional integrated circuit apparatus 81 has a configuration in which the first wafer 101 where an integrated circuit is formed, and the second wafer 102 where an integrated circuit is formed are directly bonded to each other (Front to Back).

The insulating film 2b and the insulating film 3b over the vias 5a of the first wafer 101 are etched to form a through hole 41 to expose the surface of the semiconductor substrate 1b, in the integrated circuit formation region 300. An insulating film 42 is buried in the through hole 41. Silicon dioxide ($SiO_2$), for example, is used for the insulating film 42. In the region of the insulating film 42 that is buried in the through hole 41, a plurality of microscopic through holes 9a is provided to expose the surfaces of the vias 5a.

The through holes 9a are formed by etching the insulating film 42 and the semiconductor substrate 1b with RIE method using a resist film as a mask, the resist film being formed by using the well-known lithography method. The through holes 9a are aligned with the respective vias 5a with high accuracy by use of the alignment markers 6 as a reference. The three-dimensional integrated circuit apparatus 81 is divided into individual pieces by dicing, for example, and each piece is sealed and used as a three-dimensional integrated circuit having higher degree of integration.

As shown in FIG. 15, the side surface of the through hole 9a is provided with a sidewall insulating film 43. A through electrode 10b is buried in the through hole 9a which is provided with the sidewall insulating film 43. The through electrode 10b is composed of barrier metal and tungsten (W), for example.

In the three-dimensional integrated circuit apparatus 81, alignment between the vias 5a and the respective through electrodes 10b is made with high accuracy. In addition, a plurality of through electrodes 10b can be provided in the insulating film 42 and the semiconductor substrate 1b with the sidewall insulating film 43 being interposed between the through electrodes 10b and the insulating film 42, the semiconductor substrate 1b. Consequently, the diameter of the through electrodes 10b can be on the order of submicron, and thus the through electrodes 10b may be formed in high density. Therefore, CR delay caused by the through electrodes 10b may be significantly reduced.

In the embodiment, the vias 5a are directly connected to the respective through electrodes 10b, however, the invention is not limited to this configuration. The vias 5a and the respective through electrodes 10 may be connected to each other via a wiring layer on the vias 5a, for example.

As described above, in the three-dimensional integrated circuit apparatus in the embodiment, the first wafer 101 and the second wafer 102 where respective integrated circuits are formed are directly bonded together. The insulating films 2b, 3b of the second wafer 102 provided on the vias 5a of the first wafer 101 are etched to form the through hole 41. The second wafer 102 portion on the alignment marker 6 of the first wafer 101 is etched to form the through hole 7b to expose the surface of the alignment marker 6. The insulating film 42 is buried in the through hole 41. The insulating film 8 is buried in the through hole 7b. In the region of the insulating film 8 that is buried in the through hole 41, the through holes 9a are provided to expose the surfaces of the vias 5a, the through holes 9a being narrower than the through hole 41 in width, and being aligned with the respective vias 5a with high accuracy by use of the alignment markers 6. The side surface of the through hole 9a is provided with the sidewall insulating film 43. The through electrodes 10b to be connected to the respective vias 5a are buried inside the sidewall insulating film 43.

Therefore, in addition to the effects of Embodiment 1, an etching time can be shortened due to reduced volume of the etching region of the semiconductor substrate 1b, and thus the throughput of the formation process of the through electrodes 10b may be improved. Therefore, it is possible to achieve low power consumption of the three-dimensional integrated circuit apparatus 81 due to shortening of the wiring length and reduction in the parasitic capacitance, miniaturization of the three-dimensional integrated circuit apparatus 81 due to the reduced volume, and improvement in the speed of the three-dimensional integrated circuit.

Embodiment 4

Figure 16:
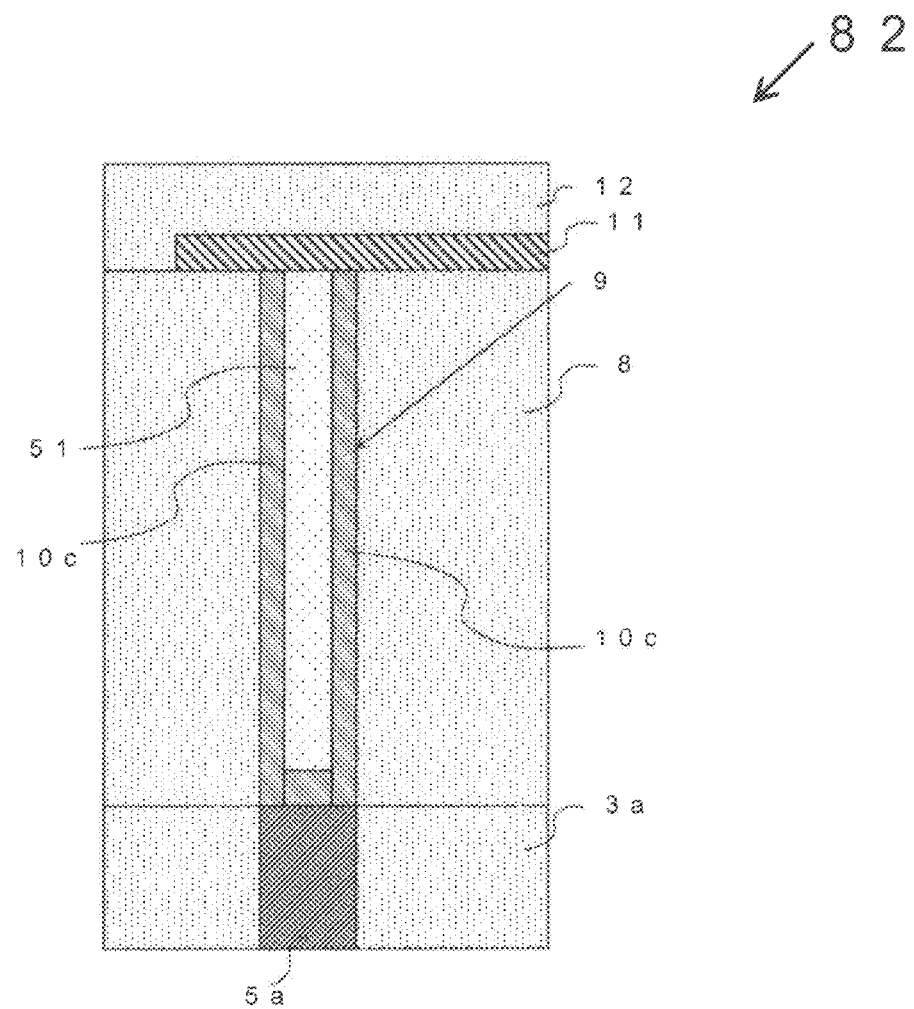
FIG. 16 is a cross-sectional view showing a three-dimensional integrated circuit apparatus according to Embodiment 4.

Next, a three-dimensional integrated circuit apparatus according to Embodiment 4 will be described with reference to the drawings. FIG. 16 is a cross-sectional view showing the three-dimensional integrated circuit apparatus. In the embodiment, the structure of the microscopic through holes is modified.

Hereinafter, the same components as those in Embodiment 1 are labeled with the same symbols and description of these components is omitted, and only different components are described.

As shown in FIG. 16, a three-dimensional integrated circuit apparatus 82 has a configuration in which the first wafer 101 where an integrated circuit is formed, and the second wafer 102 where an integrated circuit is formed are directly bonded to each other (Front to Back).

In the region of the insulating film 8 that is buried in the through hole 7a, a plurality of microscopic through holes 9 is provided similarly to Embodiment 1 to expose the surfaces of the vias 5a. The side surface and the bottom surface of the through hole 9 is provided with a through electrode 10c. The through electrode 10c at the bottom surface which is in contact with the via 5a is formed with a thickness greater than that of the side surface. The through electrode 10c is composed of barrier metal and tungsten (W), for example. An insulating film 51 is buried above the bottom surface and inside the side surface of the through-electrode 10c.

Here, the through hole 9 is provided with the through electrode 10c without filling the through hole 9 with the through electrode entirely, and thus the time required for the formation of tungsten (W) and the polishing and flattening time required by CMP method may be reduced.

As described above, in the method of manufacturing a three-dimensional integrated circuit in the embodiment, the first wafer 101 and the second wafer 102 where respective integrated circuits are formed are directly bonded together. The second wafer 102 portion on the vias 5a of the first wafer 101 is etched to form the through hole 7a. The insulating film 8 is buried in the through hole 7a. In the region of the insulating film 8 that is buried in the through hole 7a, the through holes 9 are provided to expose the surfaces of the vias 5a, the through holes 9 being narrower than the through hole 7a in width, and being aligned with the respective vias 5a with high accuracy by use of the alignment markers 6. The side surface and the bottom surface of the through hole 9 is provided with the through electrode 10c. The insulating film 51 is buried inside the electrode 10c and above the bottom surface of the electrode 10c.

Therefore, in addition to the effects of Embodiment 1, the time required for the formation of the through electrode 10c can be shortened due to reduced volume of the through electrode 10c to be buried, and thus the throughput of the formation process of the through electrodes 10b may be improved. Therefore, it is possible to achieve low power consumption of the three-dimensional integrated circuit apparatus 82 due to shortening of the wiring length and reduction in the parasitic capacitance, miniaturization of the three-dimensional integrated circuit apparatus 82 due to the reduced volume, and improvement in the speed of the three-dimensional integrated circuit.

Embodiment 5

Figure 17:
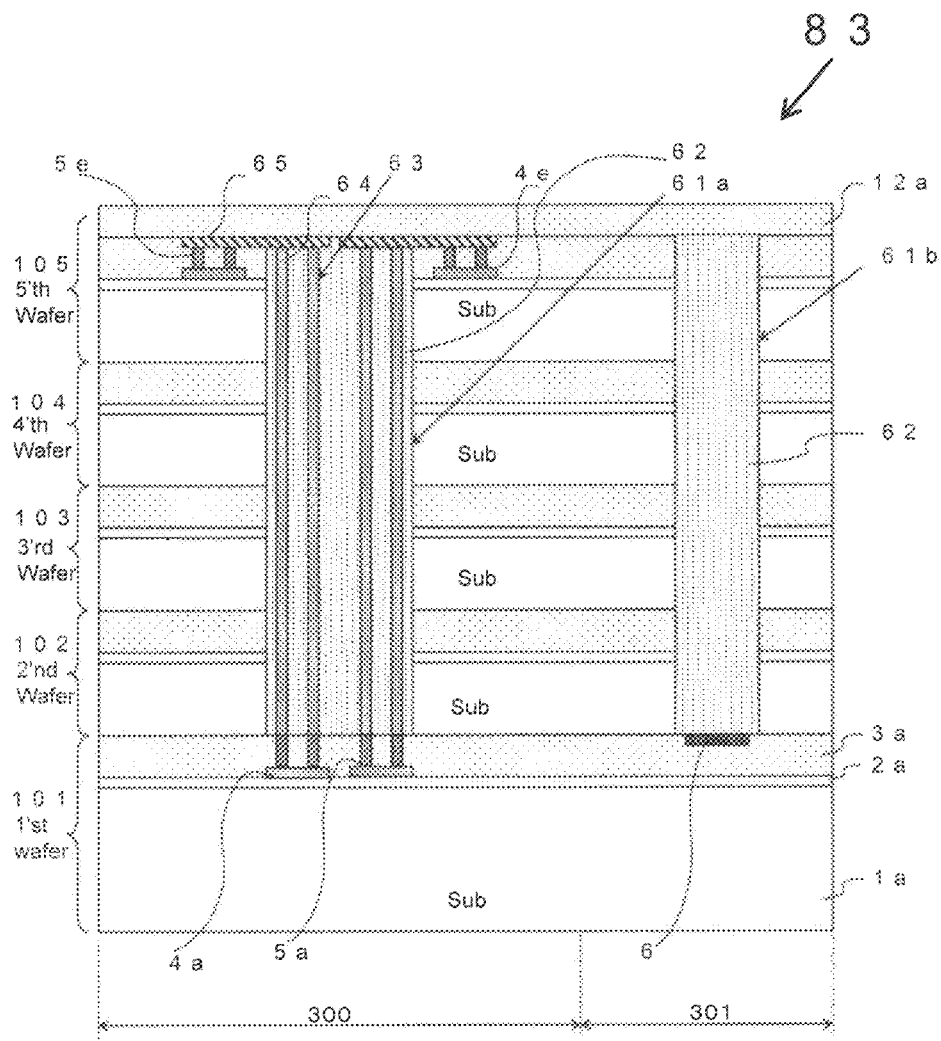
FIG. 17 is a cross-sectional view showing a three-dimensional integrated circuit apparatus according to Embodiment 5.

Next, a three-dimensional integrated circuit apparatus according to Embodiment 5 will be described with reference to the drawings. FIG. 17 is a cross-sectional view showing the three-dimensional integrated circuit apparatus. In the embodiment, the structure of the microscopic through holes is modified.

As shown in FIG. 17, a three-dimensional integrated circuit apparatus 83 has a configuration in which a first wafer 101 where an integrated circuit is formed, a second wafer 102 where an integrated circuit is formed, a third wafer 103 where an integrated circuit is formed, a fourth wafer 104 where an integrated circuit is formed, and a fifth wafer 105 where an integrated circuit is formed are stacked and directly bonded together (Front to Back). The first wafer 101, the second wafer 102, the third wafer 103, the fourth wafer 104, and the fifth wafer 105 are silicon wafers. The second wafer 102, the third wafer 103, the fourth wafer 104 and the fifth wafer 105 are thinned wafers (having a thickness of e.g., 50 μm).

The integrated circuit formation region 300 of the fifth wafer 105 is provided with a wiring layer 4e to be electrically connected to the integrated circuit of the fifth wafer 105, and vias 5e to be connected to the wiring layer 4e.

On the vias 5a of the integrated circuit formation region 300 of the first wafer 101, a through hole 61a is formed by etching the second wafer 102, the third wafer 103, the fourth wafer 104, and the fifth wafer 105 so that the surfaces of the vias 5a are exposed. On the alignment marker 6 of the alignment region 301 of the first wafer 101, a through hole 61b is formed by etching the second wafer 102, the third wafer 103, the fourth wafer 104, and the fifth wafer 105 so that the surface of the alignment marker 6 is exposed.

An insulating film 62 is buried in the through holes 61a and 61b. In the region of the insulating film 62 that is buried in the through hole 61a, a plurality of microscopic through holes 63 is provided to expose the surfaces of the vias 5a, the through holes 63 being aligned with the respective vias 5a with high accuracy by use of the alignment markers 6 as a reference mark. Silicon dioxide (SiO$_2$), for example, is used for the insulating film 62.

An through electrode 64 is buried in each of the through holes 63. The through electrode 64 is composed of barrier metal and tungsten (W), for example. The vias 5a of the first wafer 101 and the vias 5e of the fifth wafer 105 are electrically connected to each other via the through electrode 64 and a wiring layer 65. An insulating film 12a is provided on the insulating film 62 and the wiring layer 65, and serves as a surface protection film for the three-dimensional integrated circuit apparatus 83.

In the embodiment, the vias 5a are directly connected to the respective through electrodes 64, however, the invention is not limited to the configuration. The vias 5a and the respective through electrodes 64 may be connected to each other via a wiring layer on the vias 5a, for example. The three-dimensional integrated circuit apparatus 83 is divided into individual pieces by dicing, for example, and is sealed and used as a three-dimensional integrated circuit having higher degree of integration.

As described above, in the three-dimensional integrated circuit apparatus in the embodiment, the first wafer 101, the second wafer 102, the third wafer 103, the fourth wafer 104, and the fifth wafer 105 where the respective integrated circuits are formed are stacked and bonded together. The second wafer 102, the third wafer 103, the fourth wafer 104, and the fifth wafer 105 that are over the vias 5a of the first wafer 101 are etched so that the through hole 61a is formed to expose the surfaces of the vias 5a. The second wafer 102, the third wafer 103, the fourth wafer 104, and the fifth wafer 105 that are over the alignment marker 6 of the first wafer 101 are etched so that the through hole 61b is formed to expose the alignment marker 6. The insulating film 62 is buried in the through holes 61a and 61b. In the region of the insulating film 62 that is buried in the through hole 61a, the through holes 63 are provided to expose the surfaces of the vias 5a, the through holes 63 being narrower than the through hole 61a in width, and being aligned with the respective vias 5a with high accuracy by use of the alignment markers 6. Each of the through holes 63 is provided with the through electrode 64 to be connected to the via 5a. The through electrode 64 is electrically connected to the via 5e of the fifth wafer 105 via the wiring layer 65.

In this manner, the integrated circuit of the first wafer 101 and the integrated circuit of the fifth wafer 105 are connected to each other using the microscopic through electrode 64, and thus the transmission line length can be shortened. In addition, the surrounding of the through electrodes 64 is provided with the insulating film 62, and thus the parasitic capacitance may be reduced. Therefore, it is possible to achieve low power consumption of the three-dimensional integrated circuit apparatus 83 due to shortening of the wiring length and reduction in the parasitic capacitance, miniaturization of the three-dimensional integrated circuit apparatus 83 due to the reduced volume, and improvement in the speed of the three-dimensional integrated circuit.

In the embodiment, the through electrodes 64 and the wiring layers of the first and fifth wafers are interconnected by the vias, however, the through electrodes 64 may be directly connected to the wiring layers of the first and fifth wafers. For example, a plurality of through electrodes to be connected to respective plural wiring layers may be provided in a radial central portion of a wiring layer pattern in which the plural wiring layers extending radially are provided. Although the vias 5a of the first wafer 101 and the vias 5e of the fifth wafer 105 are electrically connected via the microscopic through electrodes 64 and the wiring layer 65, the vias of the second wafer 102, the vias of the third wafer 103, and the vias of the fourth wafer 104 may be electrically connected to the vias 5a of the first wafer 101 via through electrodes and a wiring layer.

Embodiment 6

Figure 18:
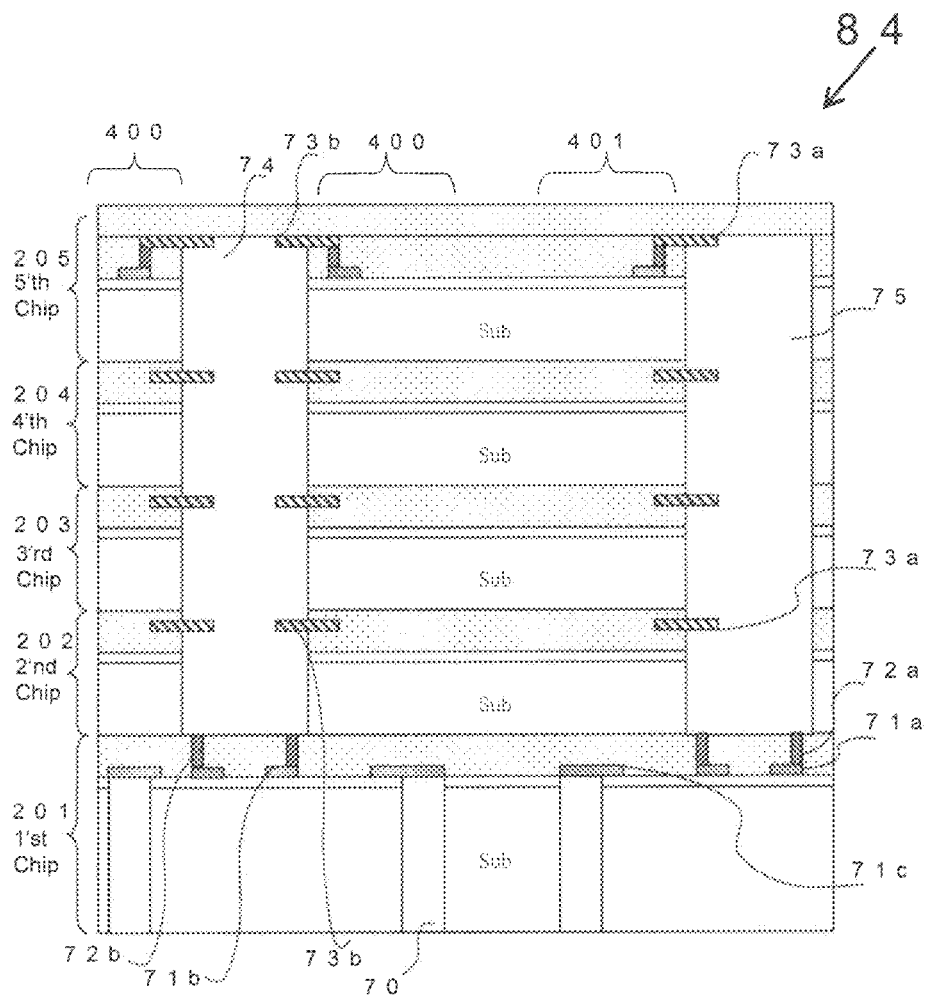
FIG. 18 is a cross-sectional view showing a three-dimensional integrated circuit apparatus according to Embodiment 6.

Next, a three-dimensional integrated circuit apparatus according to Embodiment 6 will be described with reference to the drawings. FIG. 18 is a cross-sectional view showing the three-dimensional integrated circuit apparatus. In the embodiment, microscopic through electrodes are used for the three-dimensional memory circuit.

As shown in FIG. 18, a three-dimensional integrated circuit apparatus 84 has a configuration in which a first chip 201 where an integrated circuit is formed, a second chip 202 where an integrated circuit is formed, a third chip 203 where an integrated circuit is formed, a fourth chip 204 where an integrated circuit is formed, and a fifth chip 205 where an integrated circuit is formed are directly bonded together in this order (Front to Back).

The first chip 201, the second chip 202, the third chip 203, the fourth chip 204, and the fifth chip 205 are silicon chips. The second chip 202, the third chip 203, the fourth chip 204, and the fifth chip 205 are thinned chips (having a thickness of e.g., 50 μm).

The upper portion of the first chip 201 is provided with integrated circuits such as an I/O interface, a control circuit, a buffer, a latch circuit, and a sense amplifier. The first chip 201 is provided with, on the upper portion, wiring layers 71a to 71C to be electrically connected to an integrated circuit. A via 72a is buried in an opening on the wiring layer 71a to be in contact with the wiring layer 71a, the opening being formed by etching an insulating film. A via 72b is buried in an opening on the wiring layer 71b to be in contact with the wiring layer 71b, the opening being formed by etching an insulating film. Plural pieces of the vias 72a, 72b, and the wiring layers 71a to 71C are provided. The lower portion of the wiring layer 71c is provided with a through electrode portion 70 which is to be in contact with the wiring layer 71c, the through hole being formed by etching an insulating film and a silicon substrate. Communication of information with the outside of the three-dimensional integrated circuit apparatus 84 is performed via the through-electrode portion 70.

The second chip 202, the third chip 203, the fourth chip 204, and the fifth chip 205 are provided with a plurality of respective memory array regions 400 and decoder regions 401. The memory array regions 400 form a memory cell block, and one end of the memory cell block is provided with the decoder regions 401.

Through holes are provided on the top of the first chip 201 to expose the respective surfaces of the vias 72a and 72b, the through holes being formed by etching the second chip 202, the third chip 203, the fourth chip 204, and the fifth chip 205. A plurality of microscopic through electrodes is provided in the region of the insulating film that is buried in each of the through holes.

A multi through electrode portion (BL) 74, which is formed of a plurality of microscopic through electrodes, are provided between the memory array regions 400, the microscopic through electrodes being connected to the vias 72b. A multi through electrode portion (address line) 75, which is formed of a plurality of microscopic through electrodes, are provided at one end of the decoder region 401, the microscopic through electrodes being connected to the vias 72a.

The multi through electrode portion (BL) 74 is provided with (m×n) microscopic through electrodes, for example, which are insulated from each other by an insulating film. The microscopic through electrodes electrically interconnect the vias 72b of the first chip 201 and the wiring layer 73b provided in the second chip 202, the third chip 203, the fourth chip 204, and/or the fifth chip 205.

The multi through electrode portion (address line) 75 is provided with (K×L) microscopic through electrodes, for example, which are insulated from each other by an insulating film. The microscopic through electrodes electrically interconnect the vias 72a of the first chip 201 and the wiring layer 73a provided in the second chip 202, the third chip 203, the fourth chip 204, and/or the fifth chip 205.

The microscopic through electrodes provided in the multi through electrode portion (BL) 74 and the multi through electrode portion (address line) 75 are formed in a similar manner to that in Embodiment 1.

Next, the operation of the memory that is provided in the three-dimensional integrated circuit apparatus 84 will be described. In the write operation of the memory that is provided in the three-dimensional integrated circuit apparatus 84, an address signal is outputted from the control circuit of the first chip 201, for example. The address signal is inputted to the decoder region 401, which is provided in the second chip 202, the third chip 203, the fourth chip 204, and/or the fifth chip 205, via the through electrodes of the multi through electrode portion (address line) 75, and is decoded and inputted to a predetermined memory cell of the memory array region 400 so that information is written in.

On the other hand, in the read operation of the memory that is provided in the three-dimensional integrated circuit apparatus 84, the information in the predetermined memory cell in which the information has been written is read. The information read from the memory cell is inputted to the first chip 201 via the through electrodes of the multi through electrode portion (BL) 74. The information in the memory cell, which has been inputted to the first chip 201, is outputted to the outside of the three-dimensional integrated circuit apparatus 84 via the sense amplifier, the latch circuit, the buffer, and the I/O interface that are provided in the first chip 201.

In the three-dimensional integrated circuit apparatus 84, the multi through electrode portion (BL) 74, in which the microscopic through electrodes are tied to a bit line (BL), is used, and the multi through electrode portion (address line) 75, in which the microscopic through electrodes are tied to an address line, is used. The microscopic through electrodes are insulated from each other by an insulating film. The microscopic through electrodes electrically interconnect the memory cell and the write, read portions which are provided in the second chip 202, the third chip 203, the fourth chip 204, and/or the fifth chip 205 in the shortest distance.

As described above, in the three-dimensional integrated circuit apparatus in the embodiment, the first chip 201, the second chip 202, the third chip 203, the fourth chip 204, and the fifth chip 205 are stacked and bonded together. On the vias 72b of the first chip 201, an insulating film is buried in an opening in which the vias 72b are exposed, the opening being formed by etching the second chip 202, the third chip 203, the fourth chip 204, and the fifth chip 205. In the region of the insulating film, the multi through electrode portion (BL) 74 provided with a plurality of microscopic through electrodes is formed. On the vias 72a of the first chip 201, an insulating film is buried in an opening in which the vias 72a are exposed, the opening being formed by etching the second chip 202, the third chip 203, the fourth chip 204, and the fifth chip 205. In the region of the insulating film, the multi through electrode portion (address line) 75 provided with a plurality of microscopic through electrodes is formed. The through electrodes of the multi through electrode portion (BL) 74 electrically interconnect the vias 72b and the wiring layer 73b in the second chip 202, the third chip 203, the fourth chip 204, and/or the fifth chip 205. The through electrodes of the multi through electrode portion (address line) 75 electrically interconnect the vias 72a and the wiring layer 73a in the second chip 202, the third chip 203, the fourth chip 204, and/or the fifth chip 205.

In this manner, the microscopic through electrodes are used for the bit line and the address line, and thus the transmission line length can be shortened. In addition, the parasitic capacitance of the through electrodes may be reduced. Therefore, it is possible to achieve low power consumption of the three-dimensional integrated circuit apparatus 84 due to shortening of the wiring length and reduction in the parasitic capacitance, miniaturization of the three-dimensional integrated circuit apparatus 84 due to the reduced volume, and high-speed writing and reading of the three-dimensional integrated circuit apparatus 84 as a three-dimensional memory.

In the embodiment, a plurality of through electrodes provided in the multi through electrode portion (BL) 74 and the multi through electrode portion (address line) 75, and the wiring layers in the first to fifth chips are interconnected by the vias, however, the through electrodes provided in the multi through electrode portion (BL) 74 and the multi through electrode portion (address line) 75 may be directly connected to the wiring layers in the first to fifth chips.

Embodiment 7

Figure 19:
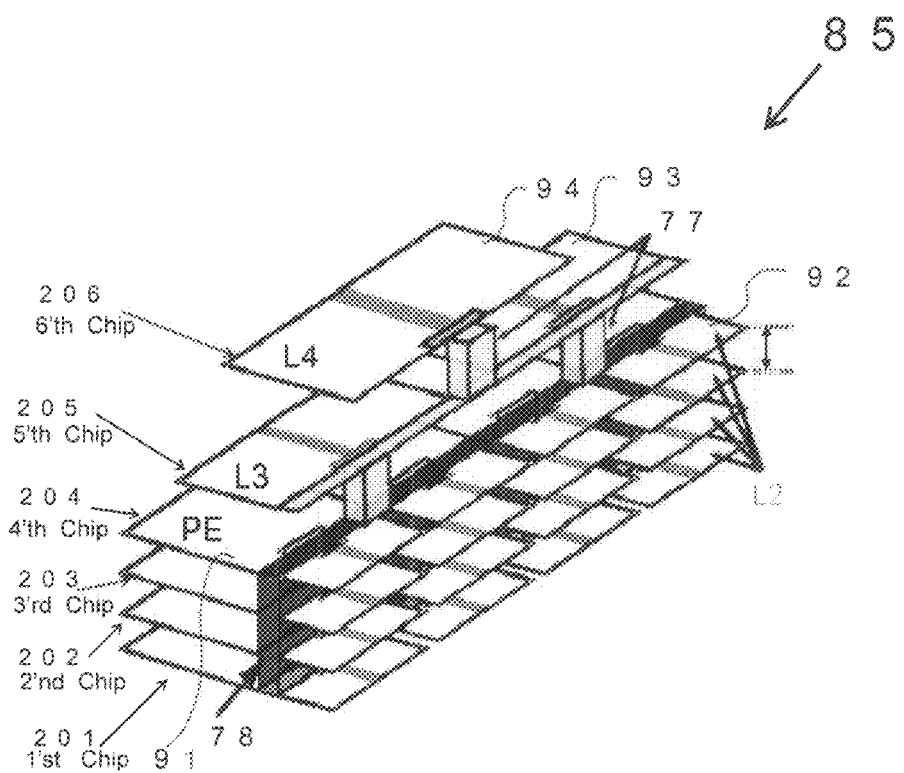
FIG. 19 is a cross-sectional view showing a three-dimensional integrated circuit apparatus according to Embodiment 7.

Next, a three-dimensional integrated circuit apparatus according to Embodiment 7 will be described with reference to the drawings. FIG. 19 is a cross-sectional view showing the three-dimensional integrated circuit apparatus. In the embodiment, a microscopic through hole is used for a three-dimensional bus circuit.

As shown in FIG. 19, a three-dimensional integrated circuit apparatus 85 has a configuration in which a first chip 201 where an integrated circuit is formed, a second chip 202 where an integrated circuit is formed, a third chip 203 where an integrated circuit is formed, a fourth chip 204 where an integrated circuit is formed, a fifth chip 205 where an integrated circuit is formed, and a sixth chip 206 where an integrated circuit is formed are directly bonded together in this order (Front to Back). The three-dimensional integrated circuit apparatus 85 is a three-dimensional multi-core processor.

The first chip 201, the second chip 202, the third chip 203, the fourth chip 204, the fifth chip 205, and the sixth chip 206 are silicon chips. The second chip 202, the third chip 203, the fourth chip 204, the fifth chip 205, and the sixth chip 206 are thinned chips (having a thickness of e.g., 50 μm).

The respective upper portions of the first chip 201 to the fourth chip 204 are provided with a processor element portion 91 and hierarchical cache memory portions 92 to 94. The cache memory portion 92 is a second layer cache (L2 (Layer 2)).

The upper portion of the fifth chip 205 is provided with a memory portion 93. The memory portion 93 is a third layer cache (L3 (Layer 3)). The upper portion of the sixth chip 206 is provided with a memory portion 94. The memory portion 94 is a fourth layer cache (L4 (Layer 4)).

The first chip 201 to the fourth chip 204 are each provided with a multi through electrode portion (3D crossbar (Xbar) Bus) 78, which is provided with a plurality of microscopic through electrodes which are insulated from each other by an insulating film. The through electrodes of the multi through electrode portion (3D Xbar Bus) 78 are used as local bus wiring that sends and receives signals between the processor element portion 91 and the cache memory portion 92. There is provided a multi through electrode portion (Common Bus) 77 between the fourth chip 204 and the fifth chip 205, and between the fifth chip 205 and the sixth chip 206, the multi through electrode portion 77 being provided with a plurality of microscopic through electrodes which are insulated from each other by an insulating film. The multi through electrode portion 77 is used as common bus wiring that sends and receives signals among the processor element portion, the cache memory portion 92, the memory portion 93, and the memory portion 94. The microscopic through electrodes provided in the multi through electrode portion 77 and the multi through electrode portion 78 are formed in a similar manner to that in Embodiment 1.

In the three-dimensional integrated circuit apparatus 85, the multi through electrode portion 78, in which the microscopic through electrodes are tied to local bus wiring, is used, and the multi through electrode portion 77, in which the microscopic through electrodes are tied to common bus wiring, is used. By using the microscopic through electrodes which are insulated from each other by an insulating film, electrical connection is made with short transmission lines.

As described above, in the three-dimensional integrated circuit apparatus in the embodiment, the first chip 201, the second chip 202, the third chip 203, the fourth chip 204, the fifth chip 205, and the sixth chip 206 are stacked and bonded together. The multi through electrode portion 78 used as local bus wiring is provided in the first chip 201, the second chip 202, the third chip 203, and the fourth chip 204 which are each provided with the cache memory portion 92 and the processor element portion 91. The multi through electrode portion 77 used as common bus wiring is provided in the fourth chip 204 which is provided with the cache memory portion 92 and the processor element portion 91, the fifth chip 205 which is provided with memory portion 93, and the sixth chip 206 which is provided with the memory portion 94.

Therefore, signal processing operation in the multi-core processor can be executed with high speed and low power consumption. In addition, miniaturization of the three-dimensional integrated circuit apparatus 85 as a three-dimensional multi-core processor may be achieved.

The invention is not limited to the above-described embodiments, and may be modified in various manners within the scope not departing from the spirit of the invention.

In the embodiment, the invention is used for three-dimensional stacked chips, but may be used for stacked wafer level CSP (chip size package). The wafer level CSP is also referred to as W-CSP. Although the silicon wafers each provided with an integrated circuit are stacked and formed, the invention is not necessarily limited to the configuration. A sensor wafer, a semiconductor device, or an integrated circuit, in which MEMS (micro electro mechanical systems) are formed, or a compound wafer (such as a GaAs wafer, a SiC wafer), for example, in which optical devices are formed may be used as needed.

What is claimed is:

1. A three-dimensional integrated circuit apparatus comprising:
   a first chip provided with a first via, a first wiring layer and an alignment marker;
   n pieces of chips (n is an integer equal to or greater than 1) stacked and bonded on a front surface side of the first chip;
   a first insulating film buried in a first through hole provided in a first region of the n pieces of chips located on the first via or the first wiring layer;
   a through electrode provided in the first insulating film, and buried in a second through hole being narrower than the first through hole in width so as to be in contact with the first via or the first wiring layer, a top of the through electrode being connected to a wiring layer of one of the n pieces of chips; and
   a second insulating film buried in a second through hole provided in a second region of the n pieces of chips located on the alignment marker.

2. The apparatus according to claim 1, wherein the first insulating film is selected from the group consisting of a silicon oxide, a TEOS film, and a Low-k insulating film.

3. The apparatus according to claim 1, wherein the through electrode includes at least one of tungsten (W), copper (Cu), and a metallic carbon nanotube.

4. The apparatus according to claim 1, wherein the first chip and the n pieces of chips are stacked and directly bonded together (Front to Back).

5. A three-dimensional integrated circuit apparatus comprising:
- a first chip provided with a first via, a second via, first to third wiring layers;
- n pieces of chips (n is an integer equal to or greater than 1) stacked and bonded on a front surface side of the first chip;
- a first multi through electrode portion has a first through electrode to connect between the first via or the first wiring layer and a wiring layer of one of the n pieces of chips, the first through electrode being provided in a first through hole, the first through hole being provided between a plurality of first regions located on the first via or the first wiring layer, the first through electrode being narrower than the first through hole; and
- a second multi through electrode portion has a second through electrode to connect between the second via or the second wiring layer and a wiring layer of one of the n pieces of chips, the second through electrode being provided in a second through hole, the second through hole being provided at a end of a second region located on the second via or the second wiring layer, the second through electrode being narrower than the second through hole.

6. The apparatus according to claim 5, wherein the first chip has an alignment marker, further comprising:
- an insulating film buried in a third through hole provided in a third region of the n pieces of chips located on the alignment marker.

7. The apparatus according to claim 6, wherein the insulating film is any one of a silicon oxide, a TEOS film, and a Low-k insulating film.

8. The apparatus according to claim 6, wherein the first and second through electrodes include at least one of tungsten (W), copper (Cu), and a metallic carbon nanotube.

9. The apparatus according to claim 5, wherein the apparatus is a three-dimensional memory circuit.

10. The apparatus according to claim 9, wherein the first region is a memory array region, the second region is a decoder region.

11. The apparatus according to claim 10, wherein an information of a memory cell read out is output to an output portion via the third wiring layer of the first chip and a third through electrode of the first chip.

* * * * *